(12) United States Patent
Cheong et al.

(10) Patent No.: US 11,600,687 B2
(45) Date of Patent: Mar. 7, 2023

(54) ELECTRONIC DEVICE PACKAGE AND DISPLAY DEVICE INCLUDING THE SAME

(71) Applicant: Samsung Display Co., Ltd., Yongin-si (KR)

(72) Inventors: Seung Hwan Cheong, Hwaseong-si (KR); Sung Bae Park, Hongcheon-gun (KR); Myung Joon Yoon, Goyang-si (KR); Kyu Min Han, Seosan-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 17/198,947

(22) Filed: Mar. 11, 2021

(65) Prior Publication Data

US 2021/0288128 A1 Sep. 16, 2021

(30) Foreign Application Priority Data

Mar. 13, 2020 (KR) .................. 10-2020-0031528
Dec. 17, 2020 (KR) .................. 10-2020-0177408

(51) Int. Cl.
*H01L 23/552* (2006.01)
*H01L 27/32* (2006.01)
(Continued)

(52) U.S. Cl.
CPC ...... *H01L 27/3276* (2013.01); *H01L 23/3128* (2013.01); *H01L 23/4985* (2013.01);
(Continued)

(58) Field of Classification Search
CPC ............. H01L 27/3276; H01L 23/3128; H01L 23/49838; H01L 23/4985; H01L 23/552; H01L 27/323; G06F 3/147
(Continued)

(56) References Cited

U.S. PATENT DOCUMENTS

2009/0302439 A1* 12/2009 Pagaila ............... H01L 23/3121
257/E23.18
2017/0301631 A1 10/2017 Lee et al.
(Continued)

FOREIGN PATENT DOCUMENTS

CN 204720447 U 10/2015
CN 110098130 A 8/2019
(Continued)

*Primary Examiner* — Didarul A Mazumder
(74) *Attorney, Agent, or Firm* — Lewis Roca Rothgerber Christie LLP

(57) ABSTRACT

An electronic device package includes: a substrate including a central region, and a first side region and a second side region at opposite sides of the central region; a first component in the first side region or the second side region, the first component having a first height above a surface of the substrate; a second component in the central region, the second component having a second height above the surface of the substrate that is lower than the first height; a reinforcement member in the central region and overlapping the second component, the reinforcement member having a third height above the surface of the substrate that is lower than the first height and higher than the second height; and an encapsulation member covering the first component and the second component.

12 Claims, 21 Drawing Sheets

(51) Int. Cl.
  *H01L 23/31*    (2006.01)
  *H01L 23/498*   (2006.01)
  *G06F 3/147*    (2006.01)

(52) U.S. Cl.
  CPC ...... *H01L 23/49838* (2013.01); *H01L 23/552* (2013.01); *H01L 27/323* (2013.01); *G06F 3/147* (2013.01)

(58) Field of Classification Search
  USPC ........................................ 257/40; 438/82, 99
  See application file for complete search history.

(56) References Cited

U.S. PATENT DOCUMENTS

| | | | |
|---|---|---|---|
| 2018/0049311 A1 | 2/2018 | Hoang et al. | |
| 2018/0061806 A1* | 3/2018 | Jung | H01L 23/49838 |
| 2018/0158779 A1* | 6/2018 | Yang | H01L 23/552 |
| 2019/0244907 A1* | 8/2019 | Liao | H01L 23/5389 |
| 2019/0371692 A1* | 12/2019 | Kuroyanagi | H01L 23/3178 |

FOREIGN PATENT DOCUMENTS

| | | |
|---|---|---|
| JP | 2521944 B2 | 8/1996 |
| JP | 1997-097990 A | 4/1997 |
| JP | 2019-012714 A | 1/2019 |
| KR | 10-2014-0129608 A | 11/2014 |
| KR | 10-2016-0054343 A | 5/2016 |
| KR | 10-2018-0071138 A | 6/2018 |
| KR | 10-2018-0079266 A | 7/2018 |
| KR | 10-2019-0015097 A | 2/2019 |
| KR | 10-1923616 B1 | 2/2019 |

\* cited by examiner

ELECTRONIC DEVICE PACKAGE AND DISPLAY DEVICE INCLUDING THE SAME

CROSS-REFERENCE TO RELATED APPLICATIONS

The present application claims priority to and benefits of Korean Patent Application No. 10-2020-0031528, filed in the Korean Intellectual Property Office on Mar. 13, 2020, and Korean Patent Application No. 10-2020-0177408, filed in the Korean Intellectual Property Office on Dec. 17, 2020, the entire content of which is incorporated herein by reference.

BACKGROUND

1. Field

The present disclosure relates to an electronic device package and a display device including the same.

2. Description of the Related Art

Electronic devices such as mobile phones, tablets, and multimedia players include display devices for displaying images. Display devices generally include a display panel that operates as a screen for displaying images. The display panel may receive a signal for driving the display panel through a flexible printed circuit film connected to a pad portion. A driving unit that generates a signal for driving a display panel may be implemented as an integrated circuit chip. The integrated circuit chip may be mounted on a flexible printed circuit film or a display panel.

The above information disclosed in this Background section is only for enhancement of understanding of the background and therefore the information discussed in this Background section does not necessarily constitute prior art.

SUMMARY

An integrated circuit and related components may be manufactured in one package, that is, an electronic device package. The electronic device package may be manufactured in a form having a relatively large aspect ratio due to restrictions in disposition, and a bending property may be deteriorated. When a bending characteristic is deteriorated, the electronic device package may be relatively easily damaged or cracked during handling.

The electronic device package may be mounted on a flexible printed circuit film. When the electronic device package is positioned closer to a pad portion on the flexible printed circuit film, utilization of a space inside an electronic device may be increased, and quality of signals outputted from the electronic device package and transferred to a display panel may be improved.

Some embodiments may include an electronic device package capable of improving a bending characteristic and impact resistance, and a display device including the electronic device package.

In addition, some embodiments may include a relatively improved electronic device package and a display device including the improved electronic device package.

A display device according to some embodiments includes: a substrate including a central region and a first side region and a second side region at opposite sides of the central region; a first component in the first side region or the second side region, the first component having a first height above a surface of the substrate; a second component in the central region, the second component having a second height above the surface of the substrate that is lower than the first height; a reinforcement member in the central region and overlapping the second component, the reinforcement member having a third height above the surface of the substrate that is lower than the first height and higher than the second height; and an encapsulation member covering the first component and the second component.

According to some embodiments, the reinforcement member may be covered by the encapsulation member.

According to some embodiments, the substrate may include a ground pad, and the reinforcement member may be connected to the ground pad.

According to some embodiments, the reinforcement member may cover an upper surface of the second component and surround at least a portion of a side surface of the second component.

According to some embodiments, the reinforcement member may have a shape in which a metal plate is bent.

According to some embodiments, the encapsulation member may have a fourth height at a first portion thereof covering the first component and a fifth height at a second portion thereof covering the second component, and the fourth height may be a same as the fifth height.

According to some embodiments, the reinforcement member may have a modulus of 100 GPa or more.

According to some embodiments, the reinforcement member may include stainless steel.

A display device according to some embodiments includes: a display panel; a flexible printed circuit film on the display panel; and an electronic device package on the flexible printed circuit film. The electronic device package includes: a substrate including a central region and a first side region and a second side region at opposite sides of the central region; a first component in the first side region or the second side region, the first component having a first height above a surface of the substrate; a second component in the central region, the second component having a second height above the surface of the substrate that is lower than the first height; a reinforcement member in the central region and overlapping the second component, the reinforcement member having a third height above the surface of the substrate that is lower than the first height and higher than the second height; and an encapsulation member covering the first component and the second component.

A display device according to some embodiments includes: a display panel including a first pad portion; a flexible printed circuit film including a second pad portion bonded to the first pad portion; and an electronic device package on the flexible printed circuit film. The electronic device package includes a first portion having a first height and a second portion having a second height that is lower than the first height, and the second portion is closer to the second pad portion than the first portion.

According to some embodiments, the electronic device package may include a substrate, and a first component and a second component on the substrate. The first component may be positioned at the first portion, the second component may be positioned at the second portion, and a height of the second component may be lower than a height of the first component.

According to some embodiments, the second component may have a height of 0.2 millimeters (mm) or less.

According to some embodiments, the electronic device package may further include an encapsulation member covering the first component and the second component, and a height of the encapsulation member may be lower in the second portion than in the first portion.

According to some embodiments, the electronic device package may further include a shielding layer covering the encapsulation member.

According to some embodiments, the electronic device package may further include a third portion between the first portion and the second portion, and the third portion may gradually change from the first height to the second height as the third portion goes from the first portion to the second portion.

According to some embodiments, an upper surface of the third portion may be an inclined surface with respect to a plane of the substrate.

According to some embodiments, the electronic device package may further include a third portion having a third height between the first portion and the second portion, and the third height may be lower than the first height and higher than the second height.

A display device according to some embodiments includes: a display panel including a first pad portion; a flexible printed circuit film including a second pad portion bonded to the first pad portion; and an electronic device package on the flexible printed circuit film. The electronic device package includes a first portion having a first height and a second portion having a first end with the first height and a second end with a second height that is lower than the first height, and the second portion is closer to the second pad portion than the first portion.

According to some embodiments, the electronic device package may include a substrate, and a first component and a second component positioned on the substrate. The first component may be positioned in the first portion, the second component may be positioned in the second portion, and a height of the second component may be lower than that of the first component.

According to some embodiments, the second component may have a height of 0.2 mm or less.

According to some embodiments, the electronic device package may further include an encapsulation member covering the first component and the second component, and the encapsulation member may gradually decrease in height from the first end to the second end.

According to some embodiments, the electronic device package may further include a shielding layer covering the encapsulation member.

According to some embodiments, the second portion may gradually change from the first height to the second height as the second portion goes from the first end to the second end.

According to some embodiments, an upper surface of the second portion may be an inclined surface with respect to a plane of the substrate.

An electronic component assembly according to some embodiments includes: a flexible printed circuit film including a pad portion; and an electronic device package on the flexible printed circuit film. The electronic device package includes a first portion having a first height and a second portion having a second height that is lower than the first height, and the second portion is closer to the pad portion than the first portion.

According to some embodiments, the electronic device package may include a substrate, and a first component and a second component positioned on the substrate. The first component may be positioned in the first portion, the second component may be positioned in the second portion, and a height of the second component may be lower than a height of the first component.

According to some embodiments, the electronic device package may further include an encapsulation member covering the first component and the second component, and a height of the encapsulation member may be lower in the second portion than in the first portion.

According to some embodiments, the electronic device package may further include a third portion between the first portion and the second portion, and the third portion may gradually change from the first height to the second height as the third portion goes from the first portion to the second portion.

According to some embodiments, the electronic device package may further include a third portion having a third height between the first portion and the second portion, and the third height may be lower than the first height and higher than the second height.

According to some embodiments, it may be possible to provide an electronic device package capable of improving a bending characteristic and impact resistance, and a display device including the electronic device package.

According to some embodiments, the electronic device package may be positioned closer to the pad portion, thereby reducing a size of the flexible printed circuit film and increasing utilization of an internal space of the electronic device. Quality of signals outputted from the electronic device package and transferred to the display panel may also be improved. In addition, it may be possible to reduce a manufacturing cost of the flexible printed circuit film.

DETAILED DESCRIPTION

Figure 1:
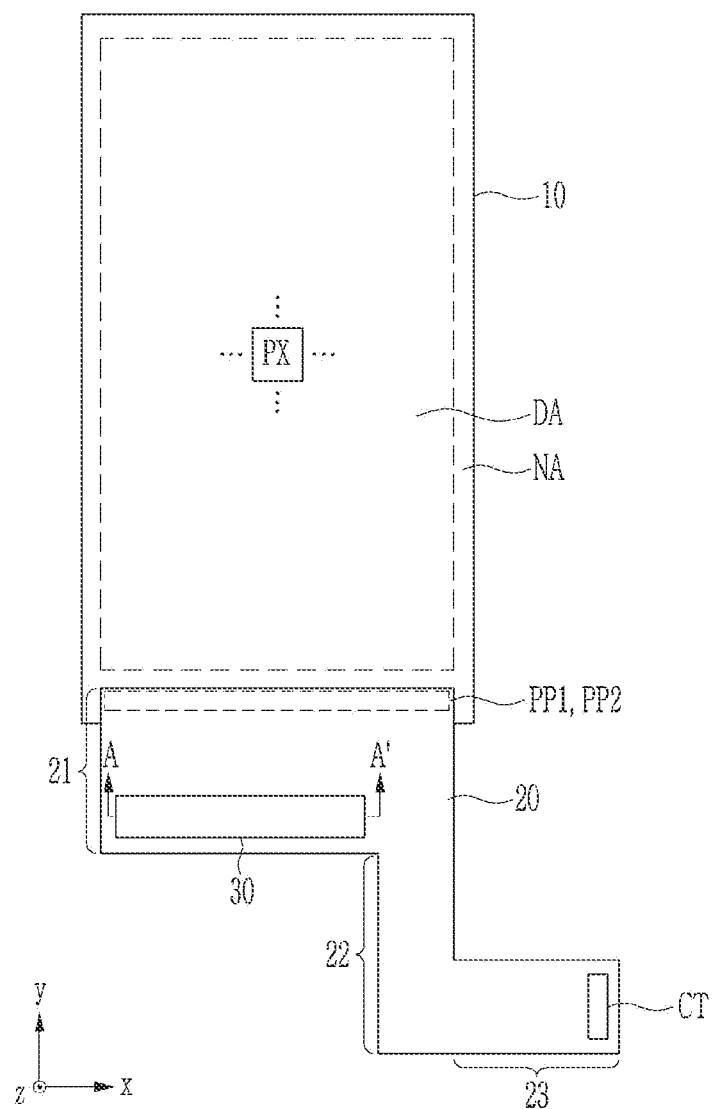
FIG. 1 illustrates a schematic top plan view of a display device according to some embodiments.

Further details of some embodiments of the inventive concept will be described more fully hereinafter with reference to the accompanying drawings, in which embodiments are shown.

Further, sizes and thicknesses of constituent elements shown in the accompanying drawings are arbitrarily given for better understanding and ease of description.

It will be understood that when an element such as a layer, film, area, or substrate is referred to as being "on" another element, it can be directly on the other element or intervening elements may also be present. In contrast, when an element is referred to as being "directly on" another element, there are no intervening elements present.

In addition, unless explicitly described to the contrary, the word "comprise" and variations such as "comprises" or "comprising" will be understood to imply the inclusion of stated elements but not the exclusion of any other elements.

In addition, in the specification, "connected" means that two or more components are not only directly connected, but two or more components may be connected indirectly through other components, physically connected as well as being electrically connected, or it may be referred to by different names depending on the location or function, but may include connecting each of parts that are substantially integral to each other.

In the drawings, the symbols x, y, and z are used to indicate directions, where the symbol x indicates a first direction, y indicates a second direction perpendicular to the first direction, and z indicates a third direction perpendicular to the first direction and the second direction.

FIG. 1 illustrates a schematic top plan view of a display device according to some embodiments.

Referring to FIG. 1, the display device includes a display panel 10. The display panel 10 includes a display area DA for displaying images, and a non-display area NA positioned around the display area DA (e.g., in a periphery or outside a footprint of the display area DA). The display area DA may correspond to a screen. Devices and/or signal lines for generating and/or transferring various signals that are applied to the display area DA may be located in the non-display area NA.

A plurality of pixels PX are arranged in a matrix form or arrangement (e.g., a plurality of rows and columns) in the display area DA of the display panel 10. Signal lines such as data lines and gate lines may also be located in the display area DA. The gate lines may extend substantially in a first direction x (e.g., a row direction), and the data lines may extend substantially in a second direction y (e.g., a column direction). A gate line and a data line may be connected to each pixel PX to receive gate signals (also referred to as scan signals) and data voltages (also referred to as data signals) from the signal lines. Driving power lines for transferring driving voltages to the pixels PX may be positioned in the display area DA, and initializing voltage lines for transferring initialization voltages to the pixels PX may be positioned. The driving voltage lines may extend approximately in the second direction y, and the initializing voltage lines may extend approximately in the first direction x.

The display panel 10 may include a touch sensor layer in which touch electrodes for sensing a contact or non-contact touch of a user are arranged. The touch electrodes may be located in the display area DA.

A pad portion PP1 may be positioned in the non-display area NA of the display panel 10. The pad portion PP1 may include pads, which are connection terminals for receiving signals from the outside of the display panel 10.

The display device may include a flexible printed circuit film 20 having a first end that is bonded to the pad portion PP1 of the display panel 10. The flexible printed circuit film 20 may include a body 21, a neck 22, and a tail 23. A pad portion PP2 that is bonded to the pad portion PP1 of the display panel 10 may be positioned in the body 21, and pads of the pad portion PP2 are electrically connected to the pads of the pad portion PP1. An electronic device package 30 may be mounted in the body 21. A size of the flexible printed circuit film 20 may be reduced by packaging components that may be scattered in the flexible printed circuit film 20 into the electronic device package 30. The neck 22 may connect the body 21 and the tail 23, and a connector CT for connection to a system of an electronic device (e.g., a mobile phone) including a display device may be positioned in the tail 23. The flexible printed circuit film 20 may receive a signal such as image data through the connector CT, and may receive a power voltage such as a driving voltage or a common voltage.

The flexible printed circuit film 20 may be bent while surrounding an edge of the display panel 10 in a state where the pad portion PP2 is connected to the pad portion PP1, so that most portions of the flexible printed circuit film 20 may be positioned on a rear surface of the display panel 10. As sizes of the body 21 and the neck 22 are reduced, utilization of the internal space of the electronic device may increase. That is, a margin and design freedom for a shape or arrangement of other devices located inside the electronic device may increase. The neck 22 may be sized by an internal wire, and the body 21 may be sized depending on a shape and a position of a component such as the electronic device package 30.

A driving unit that generates and/or processes various signals for driving the display panel 10 may be located in the non-display area NA, or may be located on the flexible printed circuit film 20. The driving unit may include a data driver for applying a data voltage to the data line, a gate driver for applying a gate signal to the gate line, and a signal controller for controlling the data driver and the gate driver.

The gate driver may be integrated as a driving circuit in the non-display area NA of the display panel 10. The driving circuit may be positioned to extend in the second direction y at opposite sides of the display area DA. The driving circuit may include a shift register including stages that are dependently connected. Each of the stages may generate a gate signal to output it to the gate line.

The data driver and the signal controller may be provided as an integrated circuit, and may be included in the electronic device package 30. The electronic device package 30 may be positioned in the body 21 of the flexible printed circuit film 20. The electronic device package 30 may be positioned in the non-display area NA (e.g., between the display area DA and the pad portion PP1) of the display panel 10. The electronic device package 30 may generally have a substantially rectangular parallelepiped shape. The electronic device package 30 may have an aspect ratio of about 2 or more, about 3 or more, or about 4 or more.

Figure 2:
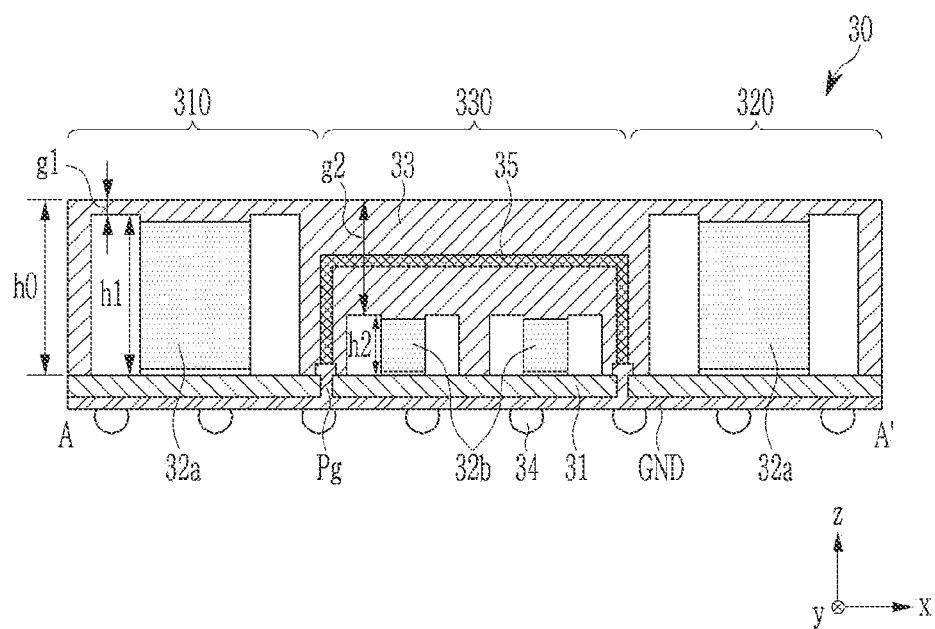
FIG. 2 illustrates a schematic cross-sectional view of an electronic device package according to some embodiments.
Figure 3A:
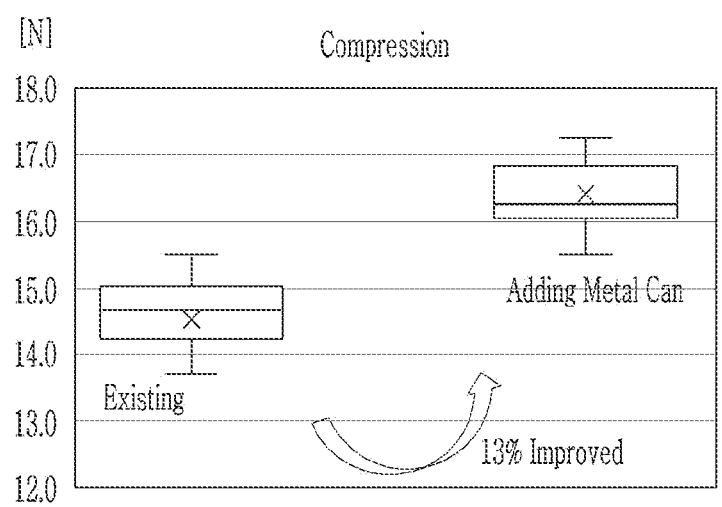
FIG. 3A and FIG. 3B illustrate graphs each showing a bending characteristic of an electronic device package according to some embodiments.
Figure 3B:
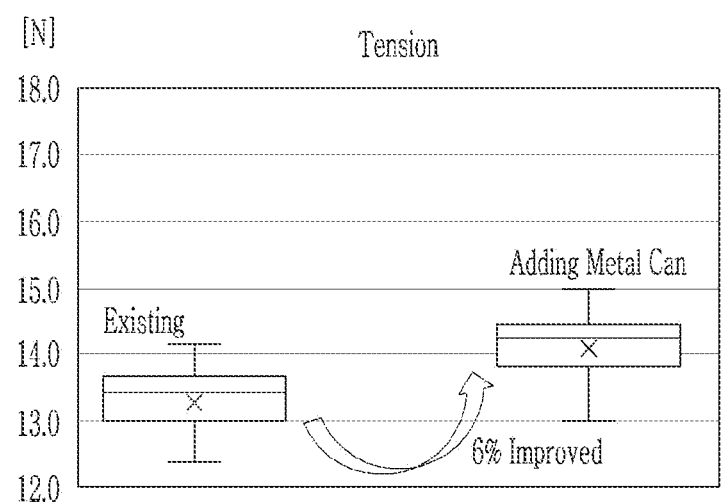

FIG. 2 illustrates a schematic cross-sectional view of an electronic device package according to some embodiments, and FIG. 3A and FIG. 3B illustrate graphs each showing a bending characteristic of an electronic device package according to some embodiments. FIG. 2 may correspond to a cross-sectional view of the electronic device package 30 taken along the line A-A' in FIG. 1.

Referring to FIG. 2, the electronic device package 30 that may be positioned in the body 21 of the flexible printed circuit film 20 is illustrated. The electronic device package 30 may be a system in package (SiP). The electronic device package 30 includes a first side portion 310, a central portion 330, and a second side portion 320 in the first direction x. The first side portion 310 and the second side portion 320 may be referred to as a periphery. In the illustrated state, the first side portion 310 is positioned at a left portion and the second side portion 320 is positioned at a right portion based on the central portion 330. The electronic device package 30 may be mounted on the flexible printed circuit film 20 so that the electronic device package 30 and the flexible printed circuit film 20 may be provided as one electronic component assembly.

The electronic device package 30 includes a substrate 31 and components 32a and 32b such as an integrated circuit, a capacitor, a resistor, and an inductor located thereon. The electronic device package 30 includes an encapsulation member 33 covering the components 32a and 32b. The electronic device package 30 includes connection terminals 34 positioned on a lower surface of the substrate 31. The electronic device package 30 includes a reinforcement member 35 positioned in the central portion 330. The reinforcement member 35 may be covered by the encapsulation member 33.

The substrate 31 may be a printed circuit board or a wiring board. The substrate 31 may include a ground line GND.

The components 32a and 32b are circuit elements constituting the electronic device package 30 such as integrated circuits, capacitors, resistors, and inductors. A number of the components 32a and 32b may be variously changed depending on a design, and may be about 10 or more, e.g., about 30 to about 60. The components 32a and 32b may have various heights, and to avoid complication, four components 32a and 32b are illustrated to be described. Embodiments are not limited to the number and height/size of the components illustrated in the figures, however, and some embodiments may include additional components or fewer components, having varying heights.

The electronic device package 30 may include a first component 32a having a relatively high first height h1 and a second component 32b having a relatively low second height h2. The first component 32a may have a height that is greater than a height (e.g., a set or predetermined height), and the second component 32b may have a height that is equal to or less than the height (e.g., the set or predetermined height). For example, the first component 32a may have a first height h1 of up to about 0.6 mm while being higher than about 0.2 mm, and the second component 32b may have a second height h2 of up to about 0.2 mm. The second height h2 may be less than about half of the first height h1.

The first component 32a may be positioned in the first side portion 310 or the second side portion 320 of the electronic device package 30. The second component 32b may be positioned in the central portion 330 of the electronic device package 30. Two first components 32a and two second components 32b are illustrated, but among all the components positioned on the substrate 31 in the electronic device package 30, components having a relatively high height may be positioned in the first side portion 310 or the second side portion 320, and components having a relatively low height may be positioned in the central portion 330. The second components 32b may also be positioned in the first side portion 310 and/or the second side portion 320, but the first components 32a may not be positioned in the central portion 330. The first component 32a may mainly be a large capacity capacitor, a high value resistor, or an integrated circuit, and the second component 32b may mainly be a small capacity capacitor or a low value resistor. Electrodes connected to pads of the substrate 31 may be positioned at opposite sides of the first component 32a and the second component 32b. The opposite portions are shown higher than a middle portion, but may be the same, and the middle portion may be higher. Shapes of the illustrated first and second components 32a and 32b are merely examples, and the electronic device package 30 may include first and second components 32a and 32b having various shapes.

The first side portion 310 is a portion including a first end of the electronic device package 30 in the first direction x, the second side portion 320 is a portion including a second end of the electronic device package 30 in the first direction x, and the central portion 330 is a portion including a center of the electronic device package 30 in the first direction x. The first side portion 310 and the second side portion 320 are positioned immediately adjacent to opposite sides of the central portion 330. A length of the central portion 330 in the first direction x may be in a range of about 20% to about 60% of a total length (corresponding to a length of a long side) of the electronic device package 30. The first side portion 310 and the second side portion 320 may be symmetric with respect to the central portion 330, but may be asymmetric. That is, the length of the first side portion 310 and a length of the second side portion 320 in the first direction x may be approximately the same or may be different. The substrate 31 includes a first side region corresponding to the first side portion 310, a second side region corresponding to the second side portion 320, and a central region corresponding to the central portion 330.

The encapsulation member 33 covering all the components 32a and 32b positioned in the substrate 31 may be formed to have substantially a same height h0. That is, the encapsulation member 33 may be formed such that an upper surface of the encapsulation member 33 is flat and substantially parallel to a plane of the substrate 31 while covering the component 32a having a highest height regardless of the height of the components 32a and 32b. Accordingly, a height h0 of the encapsulation member 33 may be substantially the same as those in the first side portion 310, the second side portion 320, and the central portion 330. The second component 32b having a low height is located in the central portion 330, and thus a gap g2 between the second component 32b and an upper surface of the encapsulation member 33 in the central portion 330 is greater than a gap g1 between the first component 32a and the upper surface of the encapsulation member 33 in the first side portion 310 or the second side portion 320. Throughout the specification, unless stated otherwise, a height refers to a height from a surface of the substrate 31.

The reinforcement member 35 is located in the central portion 330 to increase rigidity of the electronic device package 30. In general, when an external force is applied to the electronic device package 30, a bending moment may be maximum at approximately a center of the electronic device package 30. Accordingly, when an external force or impact is applied to the electronic device package 30, a crack may be relatively more likely to occur in the central portion 330, and the central portion 330 is relatively vulnerable to a bending force. The reinforcement member 35 may be located in the central portion 330 to thereby improve an overall bending force of the electronic device package 30 and prevent the electronic device package 30 from being damaged or cracked even when a greater force or impact is applied to the electronic device package 30.

The connection terminal 34 may be a solder ball or a bump. The electronic device package 30 may be connected to corresponding connection terminals of the flexible printed circuit film 20 through the connection terminals 34.

The reinforcement member 35 may be positioned to cover the second component 32b while overlapping the second component 32b in the central portion 330. Because the gap g2 between the second component 32b and the upper surface of the encapsulation member 33 is relatively large (e.g., compared to the gap g1 between the first component 32a and the upper surface of the encapsulation member 33), sufficient space for the arrangement of the reinforcement member 35 may be available between the second component 32b and the upper surface of the encapsulation member 33, and it may not be necessary to increase the height h0 of the encapsulation member 33 in order to arrange the reinforcement member 35 over the second component 32b. The height of the reinforcement member 35 may be between the first height h1 and the second height h2, that is, may be lower than the first component 32a and higher than the second component 32b. Accordingly, it may be possible to increase rigidity, a bending characteristic, and impact resistance of the electronic device package 30 without increasing a height or thickness of the electronic device package 30 or changing the dimensions or appearance of the electronic device package 30. According to some embodiments, the reinforcement member 35 may have a height that is equal to the height of the first component 32a. But, because the height of the reinforcement member 35 may be lower than an upper surface of the encapsulation member (or encapsulation material) 33 for covering the first component 32a, the reinforcement member 35 may not result in an increased overall height of the electronic device package 30.

The reinforcement member 35 may have a relatively high modulus (or referred to as a modulus of elasticity), e.g., a modulus of about 100 GPa or more, in order to increase the rigidity of the electronic device package 30. The reinforcement member 35 may be made of a metal, or a metal alloy such as stainless steel (also referred to as SUS) or Ivar. The reinforcement member 35 may be a metal plate, or may have a bent metal plate (referred to as a metal can) such as a shielding case. The reinforcement member 35 may cover an upper surface of the second component 32b and surround at least a portion of a side surface of the second component 32b. The reinforcement member 35 may be connected to a ground pad Pg on the substrate 31 to be connected to a ground line GND of the substrate 31. Accordingly, according to some embodiments, the reinforcement member 35 may function as a shielding member for protecting the second component 32b from electromagnetic interference. The reinforcement member 35 may be made of a ceramic material or a polymer such as polyimide or polyethylene terephthalate.

Referring to FIG. 3A and FIG. 3B, data at a left in each drawing shows results of a bending test of a typical electronic device package without a reinforcement member, while data at a right shows results of a bending test of the electronic device package 30 including the reinforcement member 35 formed of 0.1 mm thick stainless steel as in the above-described embodiments. The electronic device package of the comparative example and the electronic device package 30 of the example differ only in the presence or absence of the reinforcement member 35, and appearance and dimensions are the same. It can be seen that a bending force is improved by about 13% for compressive load and about 6% for tensile load by arranging the reinforcing member 35 in the central portion of the electronic device package 30.

Figure 4:
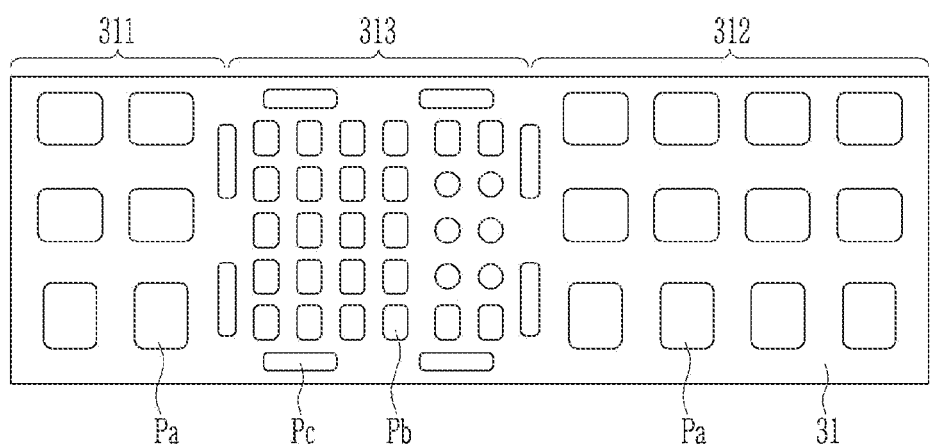
FIG. 4 to FIG. 6 illustrate a manufacturing method of an electronic device package according to some embodiments.
Figure 5:
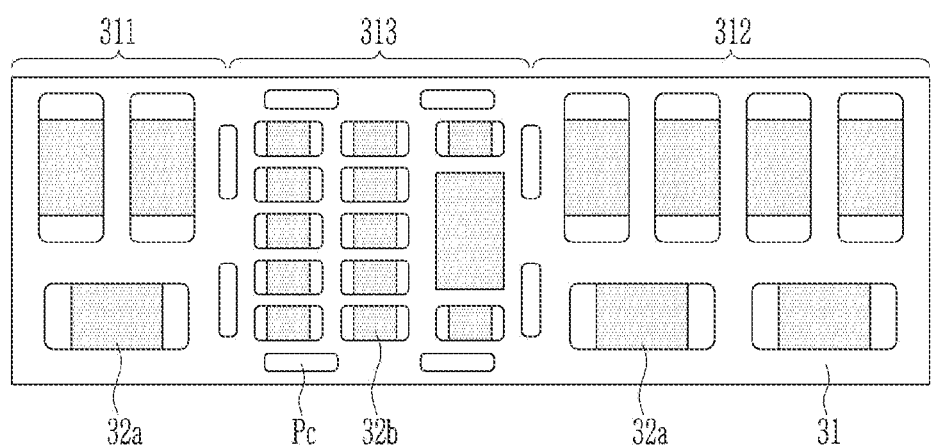
Figure 6:
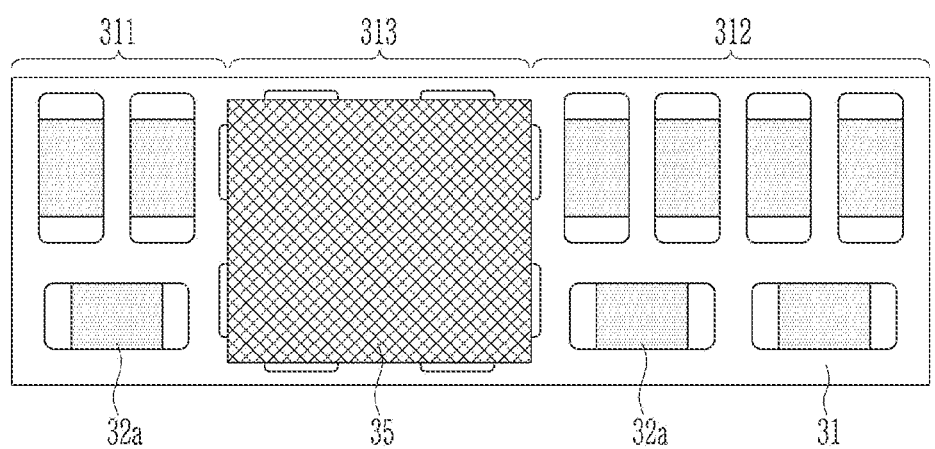

FIG. 4 to FIG. 6 illustrate a manufacturing method of an electronic device package according to some embodiments. FIG. 4 to FIG. 6 illustrate an example of manufacturing the electronic device package 30 as illustrated in FIG. 2.

Referring to FIG. 4, the substrate 31 includes a first side region 311, a second side region 312, and a central region 313 positioned therebetween. Pads Pa for mounting the first components 32a having a high height are located in the first side region 311 and the second side region 312, and pads Pb for mounting the second components 32b having a low height are located in the central region 313. Pads Pc for mounting the reinforcement member 35 may be located at an edge of the central region 313. At least one of the pads Pc may be connected to the ground line GND. Although the second side region 312 is illustrated to be wider than the first side region 311, areas of the two side regions 311 and 312 may be substantially the same, or the first side region 311 may be wider.

Referring to FIG. 5, the first components 32a are positioned on the corresponding pads Pa of the first side region 311 and the second side region 312, and the second components 32b are positioned on the corresponding pads Pb of the central region 313.

Referring to FIG. 6, the reinforcement member 35 in the form of a metal can is formed such that a side portion thereof is positioned on the pads Pc while covering the second components 32b. A reflow process may be performed to bond and connect the first components 32a, the second components 32b, and the reinforcement member 35 to the corresponding pads Pa, Pb, and Pc on the substrate 31. Then, the encapsulation member 33 may be formed by arranging the substrate 31 to which the components 32a and 32b and the reinforcement member 35 are bonded and adding an encapsulant such as an epoxy molding compound into a mold to cure it. The reinforcement member 35 may have a gap in at least a side portion thereof to allow the encapsulant to fill or penetrate into a space between the reinforcement member 35 and the second component 32b.

In this way, it may be possible to manufacture the electronic device package 30 in which the reinforcement member 35 is located in the central portion 330 without increasing a thickness thereof. Accordingly, it may be possible to increase rigidity of the electronic device package 30 without interfering with a design and arrangement of devices located inside the electronic device. The second components 32b, which each may include an integrated circuit, are covered with the grounded reinforcement member 35, and thus may be protected from electromagnetic interference.

Hereinafter, differences from the above-described embodiments will be mainly described for some embodiments.

Figure 7:
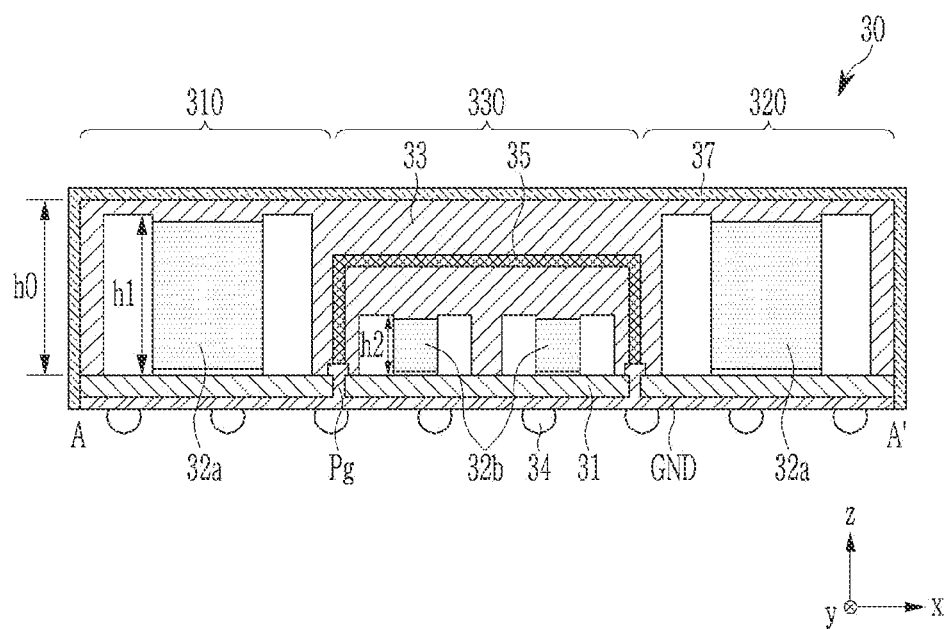
FIG. 7 illustrates a schematic cross-sectional view of an electronic device package according to some embodiments.

FIG. 7 illustrates a schematic cross-sectional view of an electronic device package according to some embodiments.

Referring to FIG. 7, the electronic device package 30 may further include a shielding layer 37. The shielding layer 37 may cover the surface of the encapsulation member 33 and a side surface of the substrate 31 that are exposed (i.e., not covered by the encapsulation member 33). The shielding layer 37 may include at least one metal layer. The shielding layer 37 may be connected to the ground line GND of the substrate 31. The shielding layer 37 may protect the components 32a and 32b inside the electronic device package 30 from electromagnetic interference. The shielding layer 37 may be formed by sputtering. The second components 32b may be double shielded by the shielding layer 37 and the reinforcement member 35.

Figure 8:
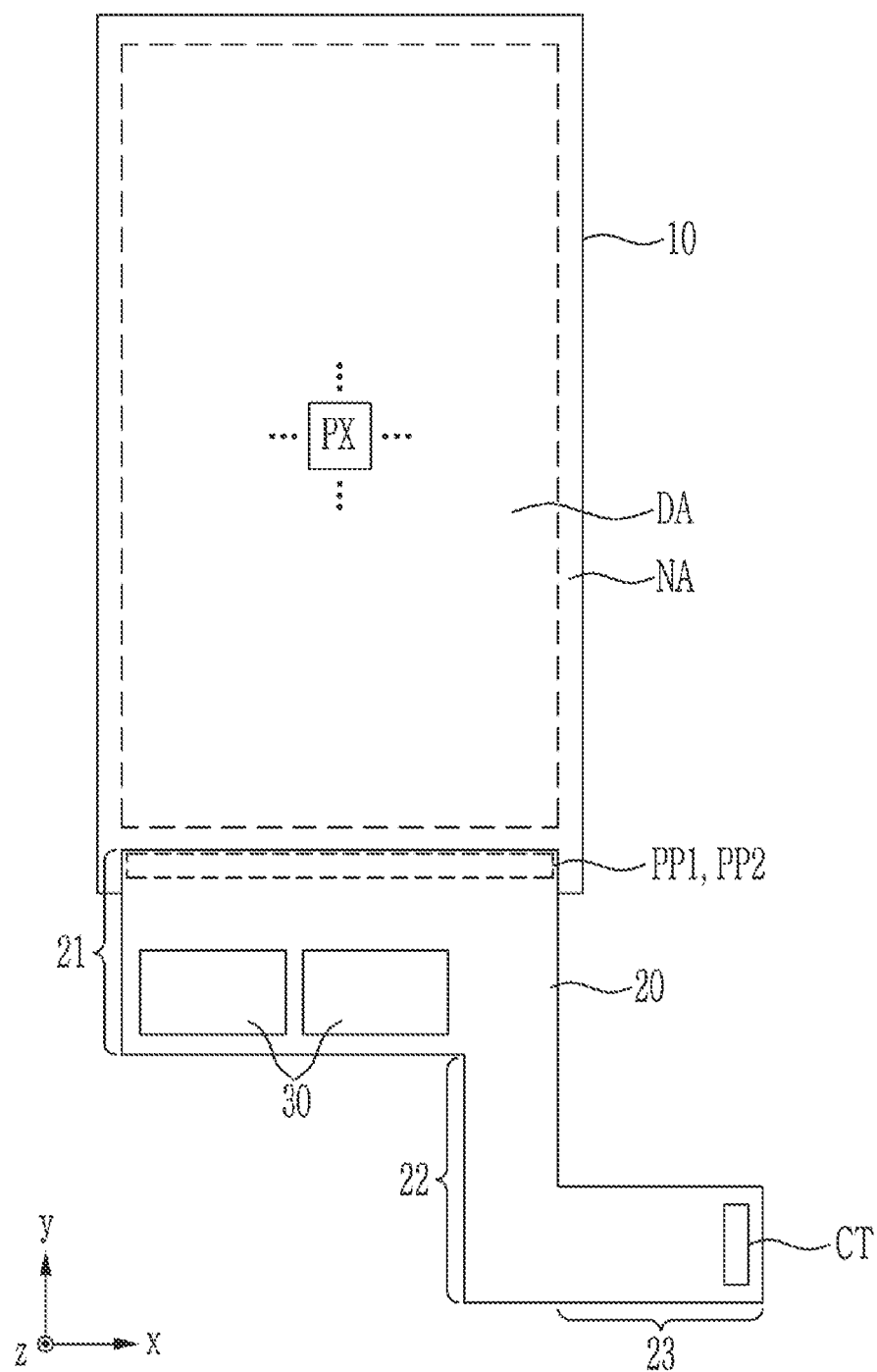
FIG. 8 illustrates a schematic top plan view of a display device according to some embodiments.

FIG. 8 illustrates a schematic top plan view of a display device according to some embodiments.

Because an overall configuration of the display device has been described in detail with reference to FIG. 1, it will be briefly described herein.

The display device includes a display panel 10, and the display panel 10 includes a display area DA and a non-display area NA. Pixels PX are located in the display area DA that may correspond to a screen. The pad portion PP1 may be positioned in the non-display area NA. The pad portion PP2 of the flexible printed circuit film 20, which may include the body 21, the neck 22, and the tail 23, may be bonded to the pad portion PP1. The display panel 10 may include a touch sensor layer including touch electrodes for sensing a touch, and the touch electrodes may be positioned in the display area DA.

A driving unit that may include a gate driver, a data driver, and a signal controller may be located in the non-display area NA, or may be located on the flexible printed circuit film 20. The gate driver may be integrated as a driving circuit in the non-display area NA. The data driver and the signal controller may be provided as an integrated circuit, and may be included in the electronic device package 30. The electronic device package 30 may be positioned in the body 21 of the flexible printed circuit film 20. According to some embodiments, two electronic device packages 30 are positioned, one of which may be for driving the pixels PX of the display panel 10, and the other may be for driving touch electrodes of the touch sensor layer. The electronic device package 30 may be positioned in the non-display area NA (e.g., between the display area NA and the pad portion PP1).

Figure 9:
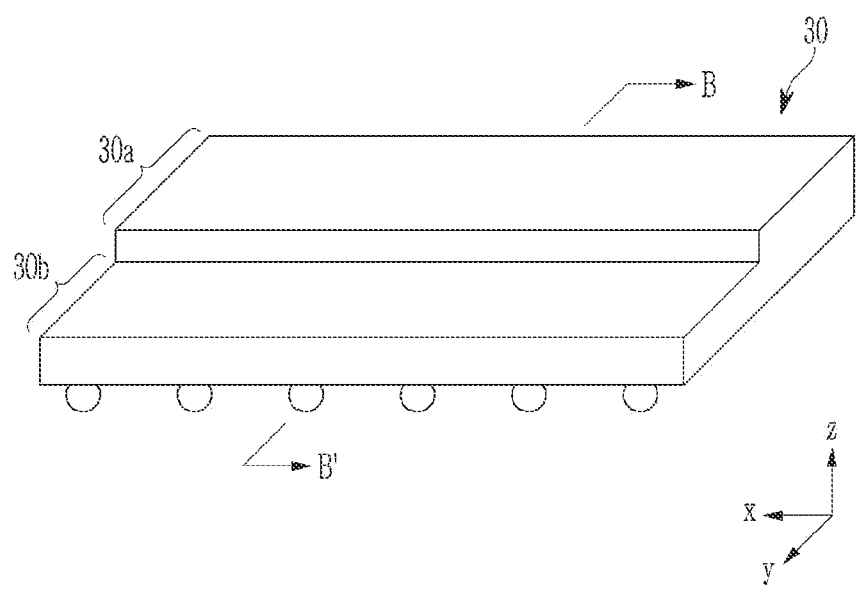
FIG. 9 illustrates a schematic perspective view of an electronic device package according to some embodiments.
Figure 10:
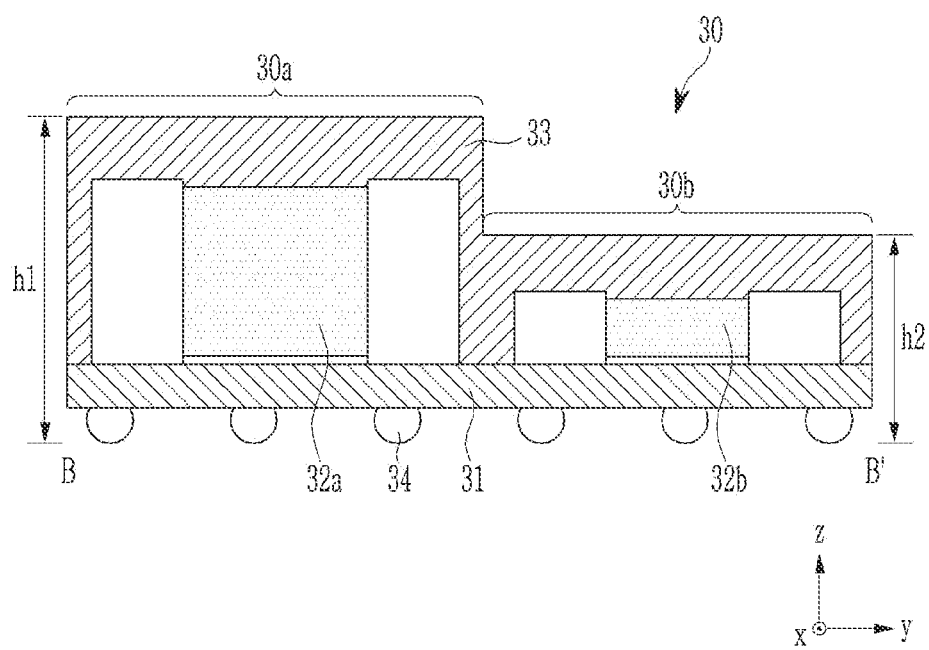
FIG. 10 illustrates a cross-sectional view of the electronic device package taken along a line B-B' of FIG. 9 according to some embodiments.
Figure 11:
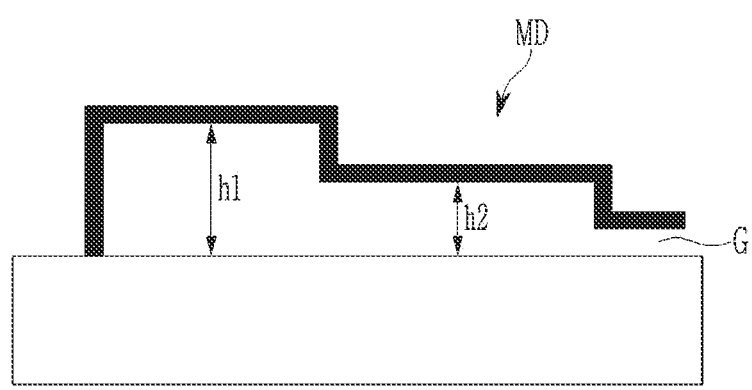
FIG. 11 illustrates a cross-sectional view of a mold for manufacturing the electronic device package illustrated in FIG. 9 according to some embodiments.

FIG. 9 illustrates a schematic perspective view of an electronic device package according to some embodiments, and FIG. 10 illustrates a cross-sectional view of the electronic device package taken along a line B-B' of FIG. 9 according to some embodiments. FIG. 11 illustrates a cross-sectional view of a mold for manufacturing the electronic device package illustrated in FIG. 9.

FIG. 9 and FIG. 10 separately illustrate the electronic device package 30 positioned in the body 21 of the flexible printed circuit film 20 in FIG. 8. The electronic device package 30 may be a system in package (SiP).

The electronic device package 30 may include a substrate 31 and components 32a and 32b such as an integrated circuit, a capacitor, a resistor, and an inductor located thereon. A number of the components 32a and 32b may be variously changed depending on a design, and may be about 10 or more, e.g., about 30 to about 60. The substrate 31 may be a printed circuit board or a wiring board. The electronic device package 30 may include an encapsulation member 33 covering the components 32a and 32b. The electronic device package 30 may include connection terminals 34 positioned on a lower surface of the substrate 31. The connection terminal 34 may be a solder ball or a bump. The electronic device package 30 may be connected to corresponding connection terminals of the flexible printed circuit film 20 through the connection terminals 34. The electronic device package 30 may be mounted on the flexible printed circuit film 20 so that the electronic device package 30 and the flexible printed circuit film 20 may be provided as one electronic component assembly.

The components 32a and 32b constituting the electronic device package 30 may have various heights, but to avoid complication, two components 32a and 32b are illustrated to be described. The electronic device package 30 may include a first component 32a that is relatively high and a second component 32b that is relatively low. For example, the first component 32a may be higher than about 0.2 mm and may have a height of up to about 0.6 mm, and the second component 32b may have a height of up to about 0.2 mm. When the electronic device package 30 is divided into two parts, the first component 32a may be positioned at a first side of the electronic device package 30, and the second component 32b may be positioned at a second side of the electronic device package 30. The first component 32a may mainly be a large capacity capacitor, a high value resistor, or an integrated circuit, and the second component 32b may mainly be a small capacity capacitor or a low value resistor. Electrodes connected to pads of the substrate 31 may be positioned at opposite sides of the first component 32a and the second component 32b. The opposite portions are shown higher than a middle portion, but may be the same, and the middle portion may be higher. Shapes of the illustrated first and second components 32a and 32b are merely examples, and the electronic device package 30 may include first and second components 32a and 32b having various shapes.

A height of the electronic device package 30 corresponding to a distance between a lower surface of the connection terminal 34 and an upper surface of the encapsulation member 33 may be determined by the highest component 32a among the components 32a and 32b. In general, the encapsulation member 33 of the electronic device package 30 may be formed to have a flat or planar top surface and a substantially rectangular cross-section while covering the highest component 32a regardless of heights of the components 32a and 32b. Accordingly, heights of the electronic device packages 30 may be substantially the same regardless of positions thereof. In contrast, the illustrated electronic device package 30 includes a first portion 30a and a second portion 30b having different heights. The first portion 30a of the electronic device package 30 has a first height h1, and the second portion 30b has a second height h2 that is lower than that of the first height h1. The electronic device package 30 may generally have a shape like a staircase. The electronic device package 30 may be mounted on the flexible printed circuit film 20 such that the second portion 30b is positioned closer to the pad portion PP2 than the first portion 30a.

The first portion 30a corresponds to a region where the first component 32a is positioned, and the second portion 30b corresponds to a region where the second component 32b is positioned. The encapsulation member 33 is not formed to have an upper surface with the same height, but is formed to have a height difference in the first portion 30a and the second portion 30b. Thicknesses of the encapsulation member 33 positioned on the first component 32a and the encapsulation member 33 positioned on the second component 32b may be similar or substantially the same. One first component 32a and one second component 32b are illustrated, but among all components positioned on the substrate 31 in the electronic device package 30, components having a height that is higher than a height (e.g., a set or predetermined height) may be positioned in the first portion 30a, and components having a height that is smaller than or equal to the height (e.g., the set or predetermined height) may be positioned in the second portion 30b.

Referring to FIG. 11, the electronic device package 30 including the first portion 30a and the second portion 30b having different heights h1 and h2 may be manufactured by using a mold MD having different heights depending on a position thereof. For example, in manufacturing the electronic device package 30, the components 32a and 32b may be positioned on the substrate 31 to be bonded to each other by reflow soldering, and then the encapsulation member 33 may be formed. The substrate 31 to which the components 32a and 32b are bonded is located in the mold MD having an inner area of the first height h1 and an inner area of the second height h2, in order to form the encapsulation member 33. In this case, the first component 32a is located in the inner area of the first height h1, and the second component 32b is located in the inner area of the second height h2. Thereafter, an encapsulant such as an epoxy molding compound is added into a gate G of the mold MD and cured to form the encapsulating member 33. As a result, the electronic device package 30 having the first portion 30a having the first height h1 and the second portion 30b having the second height h2 may be manufactured.

Hereinafter, differences from the above-described embodiments will be mainly described for some embodiments.

FIG. 12, FIG. 13, FIG. 14, FIG. 15, and FIG. 16 illustrate cross-sectional views of an electronic device package according to some embodiments.

Figure 12:
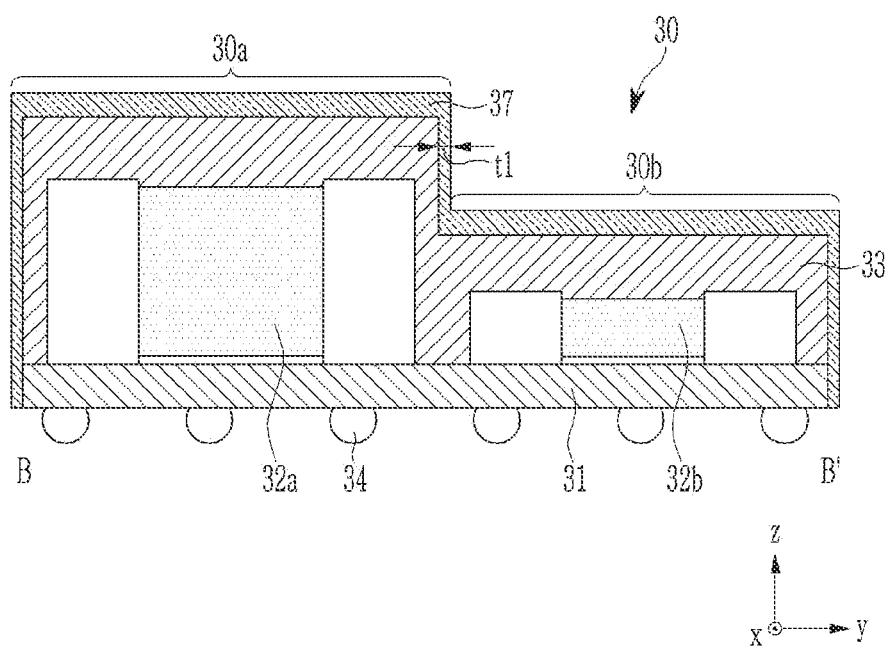
FIG. 12, FIG. 13, FIG. 14, FIG. 15, and FIG. 16 illustrate cross-sectional views of an electronic device package according to some embodiments.

Referring to FIG. 12, the electronic device package 30 may further include the shielding layer 37. The shielding layer 37 may cover the surface of the encapsulation member 33 and a side surface of the substrate 31 that are exposed. The shielding layer 37 may include at least one metal layer. The shielding layer 37 may protect the components 32a and 32b inside the electronic device package 30 from electromagnetic interference. The shielding layer 37 may be formed by sputtering. A thickness t1 of a portion of the shielding layer 37 positioned on a side surface of a portion (i.e., the first portion 30a that is adjacent to the second portion 30b) of the shielding layer 37 positioned between the first portion 30a and the second portion 30b may be smaller than a thickness of a portion of the shielding layer 37 positioned on an upper surface of the encapsulation member 33, and may be the same or almost the same as a thickness of a portion of the shielding layer 37 positioned on a side surface of the encapsulation member 33.

Figure 13:
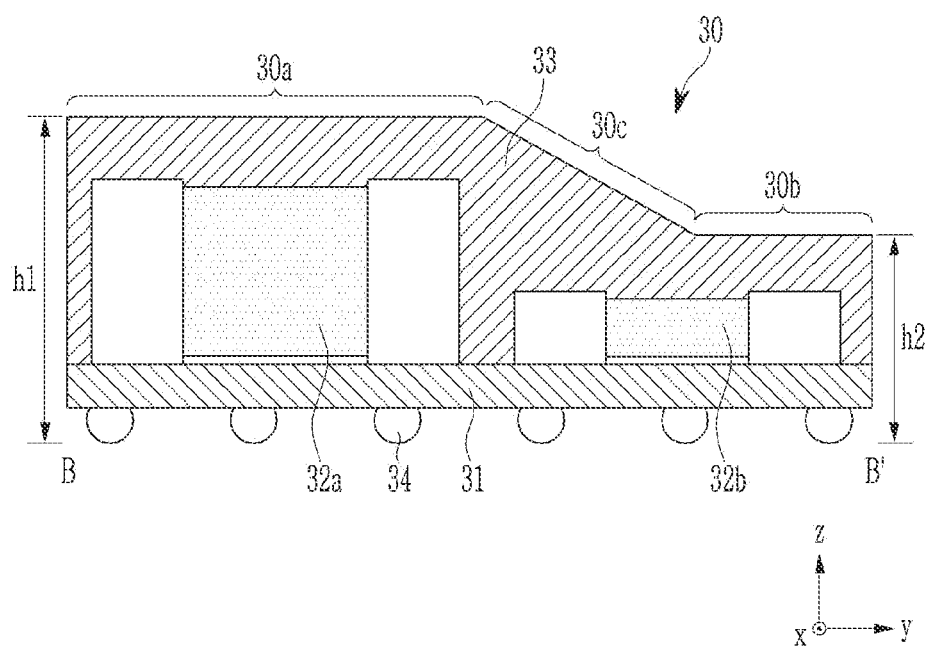

Referring to FIG. 13, the electronic device package 30 includes a third portion 30c between the first portion 30a having the first height h1 and the second portion 30b having the second height h2. In the third portion 30c, a portion adjacent to the first portion 30a has the first height h1, and a portion adjacent to the second portion 30b has the second height h2. In the third portion 30c, the thicknesses of the first portion 30a and the second portion 30b do not suddenly change, but gradually change from the first height h1 to the second height h2. The second component 32b having the low height may be mainly positioned in the third portion 30c. In the third portion 30c, the second component 32b may be positioned in a region adjacent to the second portion 30b, and a component having a height that is lower than that of the first component 32a and higher than that of the second component 32b may be positioned in a region adjacent to the first portion 30a. In the case of the embodiments described with respect to FIG. 10, a surface between the first portion 30a and the second portion 30b is approximately perpendicular to a plane of the substrate 31. In the embodiments described with respect to FIG. 13, an upper surface of the third portion 30c is an inclined surface with respect to the plane of the substrate 31. The electronic device package 30 may be mounted on the flexible printed circuit film 20 such that the second portion 30b is positioned more adjacent to the pad portion PP2 than the first portion 30a.

Figure 14:
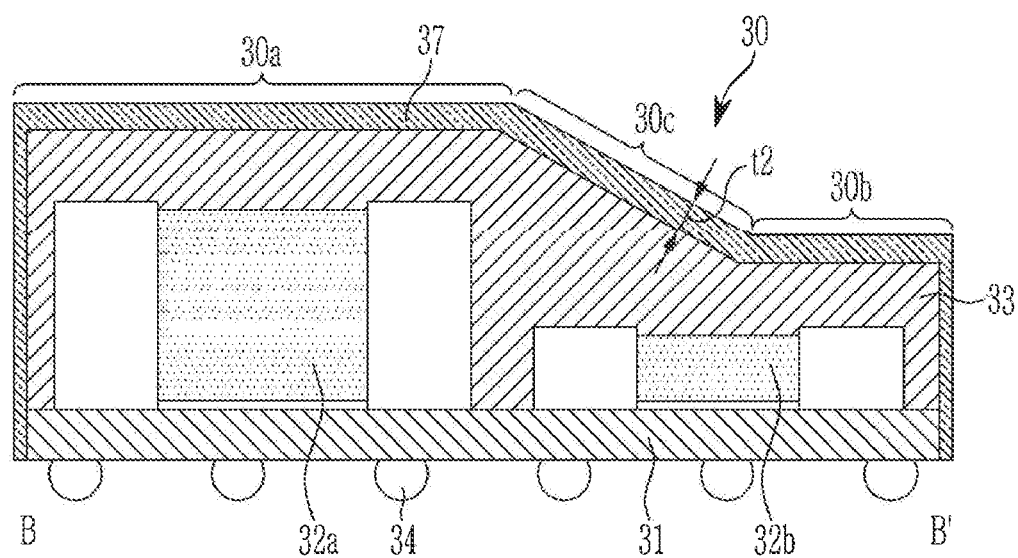

Referring to FIG. 14, embodiments in which the electronic device package 30 illustrated in FIG. 13 further include the shielding layer 37 is illustrated. The shielding layer 37 may cover a surface of the encapsulation member 33 and a side surface of the substrate 31. The shielding layer 37 may be a metal layer formed by sputtering. A thickness t2 of a portion of the shielding layer 37 positioned in the third portion 30c may be larger than a thickness of a portion of the shielding layer 37 positioned on a side surface of the encapsulation member 33, and may be equal to or approximately equal to a thickness of a portion of the shielding layer 37 positioned in the first portion 30a and the second portion 30b. Accordingly, the shielding layer 37 may be thicker than that of the embodiments described with respect to FIG. 12, and may enable protecting it against electromagnetic interference.

Figure 15:
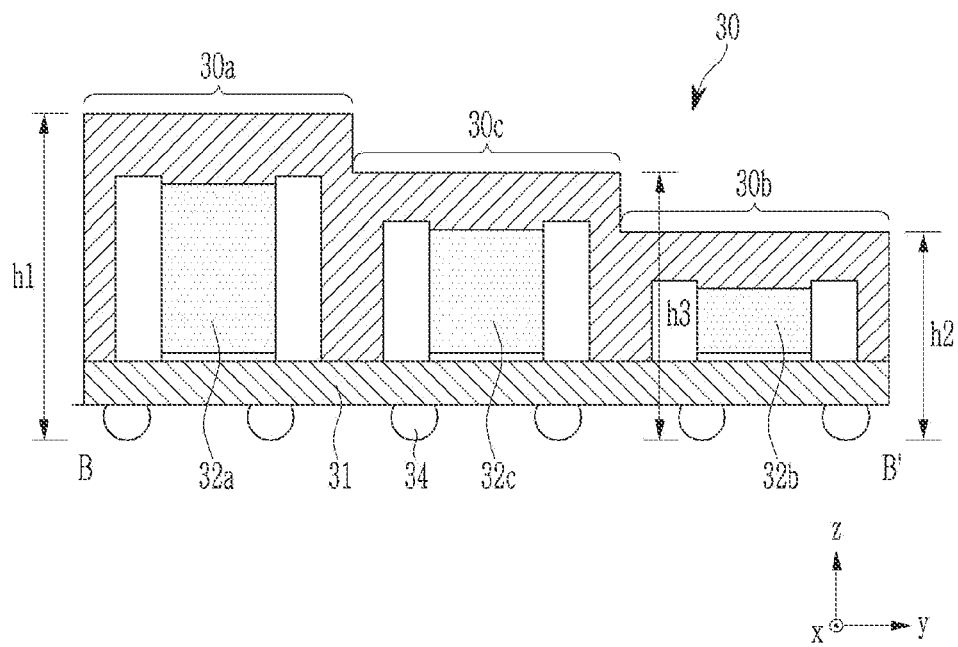

Referring to FIG. 15, the electronic device package 30 includes the first portion 30a having the first height h1, the second portion 30b having the second height h2, and a third portion 30c having a third height h3 between the first portion 30a and the second portion 30b. The third height h3 is lower than the first height h1 and higher than the second height h2. In the third portion 30c, a third component 32c having a height that is lower than the first component 32a and higher than the second component 32b may be positioned. For example, the third component 32c may have a height that is greater than about 0.2 mm and smaller than about 0.4 mm. As described above, the electronic device package 30 may include the three portions 30a, 30b, and 30c having different heights, and may include three or more portions. The electronic device package 30 may further include a shielding layer covering at least a surface of the encapsulation member 33 and a side surface of the substrate 31. In the electronic device package 30, the second portion 30b having the lowest height may be mounted on the flexible printed circuit film 20 to be adjacent to the pad portion PP2.

Figure 16:
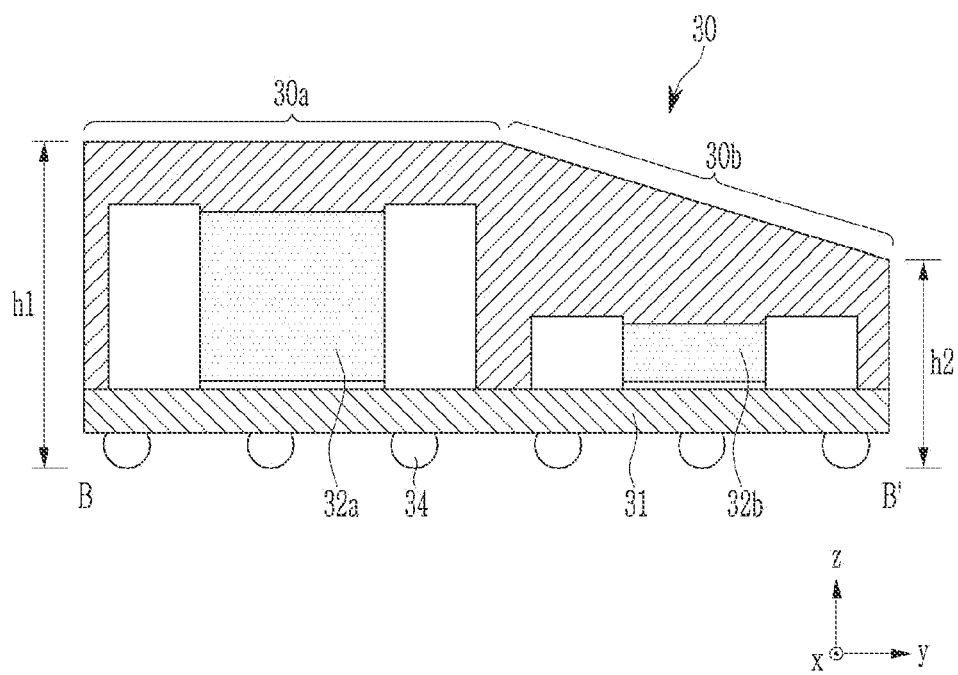

Referring to FIG. 16, the electronic device package 30 includes the first portion 30a having the first height h1 and a second portion 30b having a variable height. In the second portion 30b, a first end thereof that is adjacent to the first portion 30a has the first height h1 and a second end thereof (corresponding to a side of the electronic device package 30) has the second height h2. An upper surface of the first portion 30a is substantially parallel to the plane of the substrate 31, but an upper surface of the second portion 30b may be an inclined surface with respect to the plane of the substrate 31.

The first component 32a having the high height may be mainly positioned in the first portion 30a, and the second component 32b having the low height may be mainly positioned in the second portion 30b. A component that is lower than the first component 32a and higher than the second component 32b may be positioned in a region adjacent to the first portion 30a in the second portion 30b. The electronic device package 30 may further include a shielding layer covering at least a surface of the encapsulation member 33 and a side surface of the substrate 31. In the electronic device package 30, the second portion 30b may be mounted on the flexible printed circuit film 20 to be adjacent to the pad portion PP2.

Figure 17:
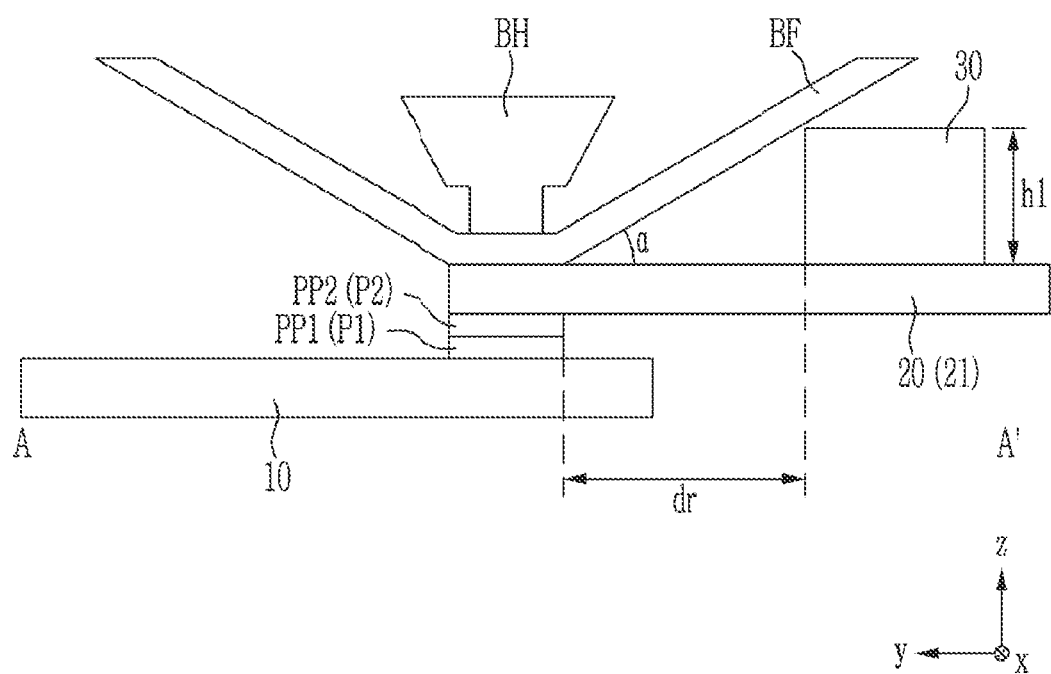
FIG. 17 schematically illustrates a process of bonding a flexible printed circuit film on which an electronic device package is mounted to a display panel according to a comparative example.
Figure 18:
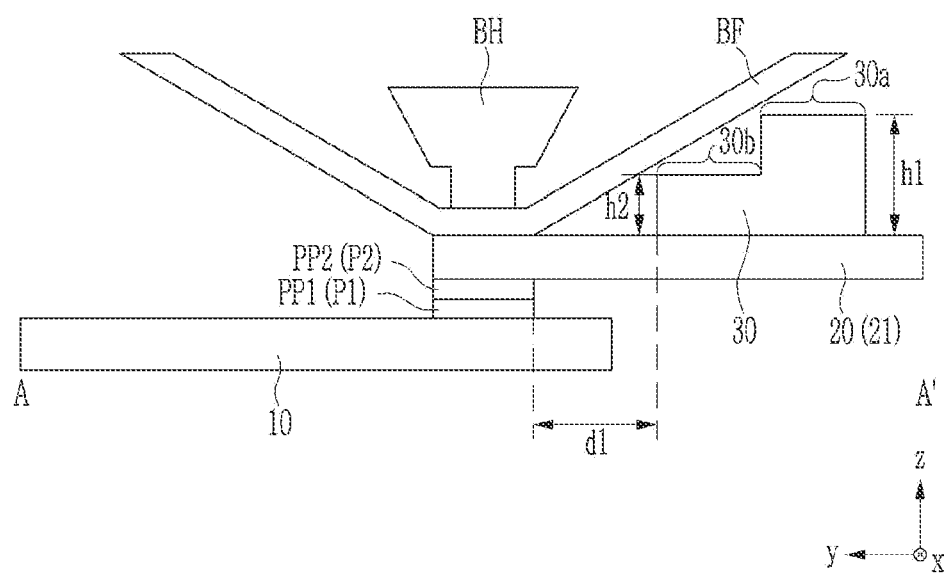
FIG. 18 schematically illustrates a process of bonding a flexible printed circuit film on which an electronic device package is mounted to a display panel according to some embodiments.
Figure 19:
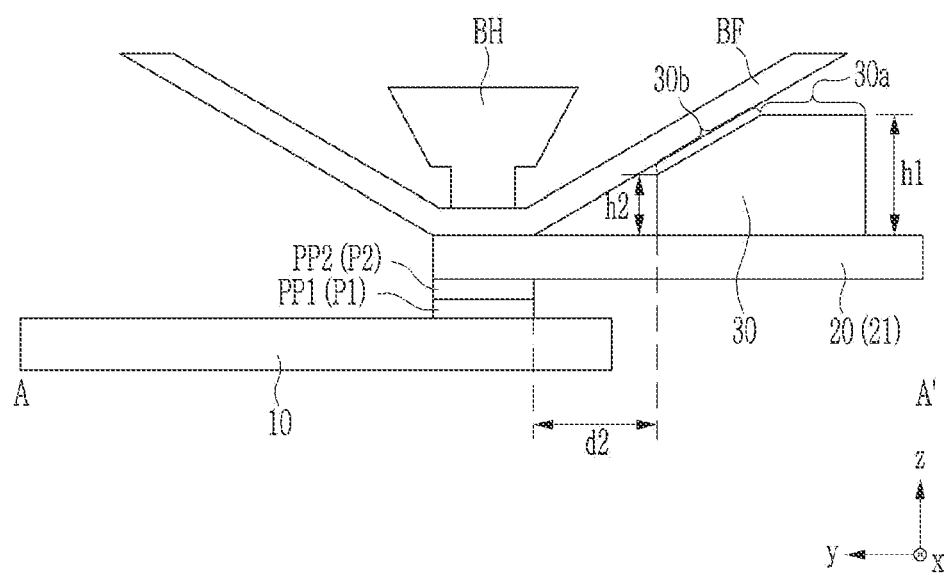
FIG. 19 schematically illustrates a process of bonding a flexible printed circuit film on which an electronic device package is mounted to a display panel according to some embodiments.

FIG. 17 schematically illustrates a process of bonding the flexible printed circuit film 20 on which the electronic device package 30 is mounted to the display panel 10 according to a comparative example, and FIG. 18 and FIG. 19 schematically illustrate a process of bonding the flexible printed circuit film 20 on which the electronic device package 30 is mounted to the display panel 10 according to an example.

Referring to FIG. 17, the electronic device package 30 having a substantially rectangular parallelepiped shape having the first height h1 that is entirely constant is mounted on the flexible printed circuit film 20. An anisotropic conductive film may be located between the pad portion PP1 of the display panel 10 and the pad portion PP2 of the flexible printed circuit film 20, and then the pad portion PP1 and the pad portion PP2 may be bonded by using a bonding machine, to electrically connect a pad P1 of the pad portion PP1 and a pad P2 of the pad portion PP2. A process of thermocompressing a compressed region (corresponding to the pad portion PP2) of the flexible printed circuit film 20 may be performed by using a bond head BH of the bonding machine during bonding. In this case, a buffering member BF formed of an elastic material such as rubber may be used such that the flexible printed circuit film 20 is not damaged by the bonding head BH. The buffering member BF may be located between the bonding head BH and the flexible printed circuit film 20 so that the bonding head BH may not directly contact the flexible printed circuit film 20, and the flexible printed circuit film 20 may be protected from the bonding head BH.

The electronic device package 30 is required to be positioned at least a minimum distance dr from the pad portion PP2 in order to avoid interference between the buffering member BF and the electronic device package 30 during the bonding process. That is, there is no problem in performing the bonding process only when a distance between the pad portion PP2 and the electronic device package 30 is the minimum distance dr or more. The minimum distance dr to avoid interference between the buffering member BF and the electronic device package 30 may be influenced by an angle α of the buffering member BF and a height h1 of the electronic device package 30, but the angle α of the buffering member BF may serve as a factor affecting process quality, which may be difficult to change.

Referring to FIG. 18, a process of bonding the flexible printed circuit film 20 on which the electronic device package 30 illustrated in FIG. 10 is mounted to the display panel 10 is illustrated. In the electronic device package 30, the second portion 30b having the second height h2 is positioned closer to the pad portion PP2 than the first portion 30a having the first height h1. Accordingly, even when the electronic device package 30 is positioned closer to the pad portion PP2 than that in the comparative example of FIG. 17, interference with the buffering member BF may be avoided. That is, a minimum distance d1 between the pad portion PP2 and the electronic device package 30 may be reduced as compared with the minimum distance dr of the comparative example. A difference between the minimum distance dr and the minimum distance d1 may be similar to or substantially the same as a width of the second portion 30b.

As such, a size of the body 21 of the flexible printed circuit film 20 may be reduced, and utilization of an internal space of the electronic device may be increased by arranging the electronic device package 30 closer to the pad portion PP2. In addition, because a length of a wire electrically connecting the pad portion PP2 and the electronic device package 30 may be reduced, quality of a signal outputted from the electronic device package 30 and transferred to the display panel 10 may be improved. In addition, because an area of the body 21 of the flexible printed circuit film 20 is reduced, a manufacturing cost of the flexible printed circuit film 20 may be reduced.

Referring to FIG. 19, a process of bonding the flexible printed circuit film 20 on which the electronic device package 30 illustrated in FIG. 16 is mounted to the display panel 10 is illustrated. In the electronic device package 30, the second portion 30b having a height between the first height h1 and the second height h2 and an inclined surface is positioned closer to the pad portion PP2 than the first portion 30a having the first height h1. Accordingly, even when the electronic device package 30 is positioned closer to the pad portion PP2 than that in the comparative example of FIG. 17, interference with the buffering member BF may be avoided. That is, a minimum distance d2 between the pad portion PP2 and the electronic device package 30 may be reduced as compared with the minimum distance dr of the comparative example. A difference between the minimum distance dr and the minimum distance d2 may be similar to or substantially the same as a width of the second portion 30b. An angle of the inclined surface of the second portion 30b with respect to the plane of the flexible printed circuit film 20 may be the same as or substantially equal to the angle α of the buffering member BF with respect to the flexible printed circuit film 20.

Meanwhile, even when the flexible printed circuit film 20 on which the electronic device package 30 illustrated in FIG. 13 is mounted or the flexible printed circuit film 20 on which the electronic device package 30 shown in FIG. 15 is mounted is bonded to the display panel 10, a minimum distance between the pad portion PP2 and the electronic device package 30 may be reduced as compared with the minimum distance dr of the comparative example.

A configuration of the display panel 10 that may be included in the display device according to some embodiments will be described in more detail with reference to FIG. 20 based on the display area DA.

Figure 20:
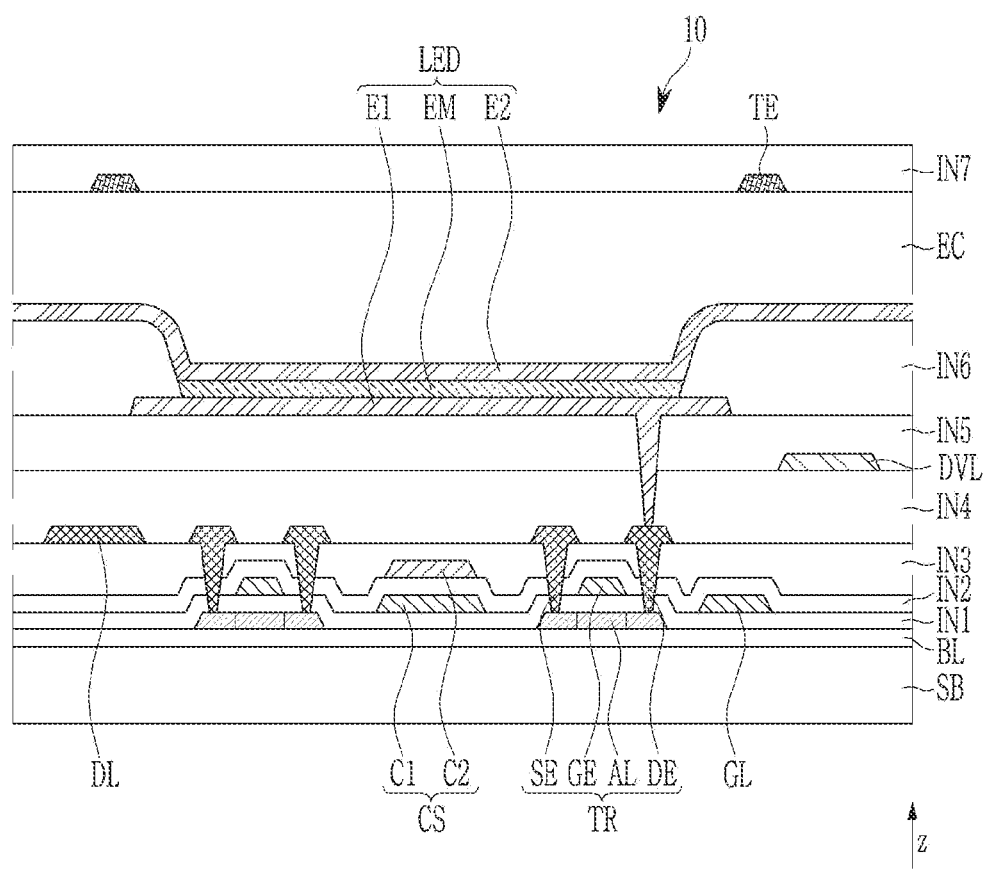
FIG. 20 illustrates a schematic cross-sectional view showing a stacked structure of a display panel according to some embodiments.

FIG. 20 illustrates a schematic cross-sectional view showing a stacked structure of a display panel according to some embodiments. The cross-section illustrated in FIG. 20 may correspond to approximately one pixel area.

The display panel 10 basically includes a substrate SB, a transistor TR formed on the substrate SB, and a light emitting diode LED connected to the transistor TR.

The substrate SB may be made of an insulating material such as glass or plastic. When the substrate SB is a plastic substrate, the substrate SB may include a barrier layer for preventing moisture, oxygen, etc. from penetrating from the outside.

A buffer layer BL may be located on the substrate SB. The buffer layer BL may include an inorganic insulating material such as a silicon oxide and a silicon nitride.

A semiconductor layer AL of the transistor TR may be located on the buffer layer BL, and a first insulating layer IN1 may be located on the semiconductor layer AL. The semiconductor layer AL may include a source region and a drain region, and a channel region between these regions. The semiconductor layer AL may include a semiconductor material such as polysilicon, an oxide semiconductor, and amorphous silicon.

A first conductor, which may include a gate electrode GE of the transistor TR, a gate line GL, and a first electrode C1 of a capacitor CS, may be located on the first insulating layer IN1.

A second insulating layer IN2 may be located on the first conductor. A second conductor that may include a second electrode C2 of the capacitor CS and the like may be located on the second insulating layer IN2. The first conductor and/or the second conductor may include a metal such as molybdenum (Mo), copper (Cu), aluminum (Al), silver (Ag), chromium (Cr), tantalum (Ta), titanium (Ti), or an alloy thereof.

A third insulating layer IN3 may be located on the second insulating layer IN2 and the second conductor. The first insulating layer IN1, the second insulating layer IN2, and/or the third insulating layer IN3 may include an inorganic insulating material.

A third conductor that may include a source electrode SE and a drain electrode DE of the transistor TR, a data line DL, and the like may be positioned on the third insulating layer IN3. The source electrode SE and the drain electrode DE may be connected to a source region and a drain region of the semiconductor layer AL through openings of the insulating layers IN1, IN2, and IN3, respectively.

A fourth insulating layer IN4 may be located on the third conductor. A fourth conductor that may include a driving voltage line DVL or the like may be positioned on the fourth insulating layer IN4. The third conductor and/or the fourth conductor are made of a metal such as aluminum (Al), copper (Cu), silver (Ag), molybdenum (Mo), chromium (Cr), gold (Au), platinum (Pt), palladium (Pd), tantalum (Ta), tungsten (W), titanium (Ti), or nickel (Ni), or a metal alloy.

A fifth insulating layer IN5 may be located on the fourth conductor. The fourth insulating layer IN4 and/or the fifth insulating layer IN5 may include an organic insulating material.

A first electrode E1 of the light emitting diode LED is located on the fifth insulating layer IN5. The first electrode E1 may be referred to as a pixel electrode. The first electrode E1 may be connected to the drain electrode DE or the source electrode SE through openings of the insulating layers IN4 and IN5 to receive a signal for controlling luminance of the light emitting diode LED. The transistor TR to which the first electrode E1 is connected may be a driving transistor or a transistor that is electrically connected to the driving transistor.

A sixth insulating layer IN6 may be located on the fifth insulating layer IN5. The sixth insulating layer IN6 may be referred to as a pixel definition layer, and may have an opening overlapping the first electrode E1. The emission member EM including an emission layer may be positioned above the first electrode E1 in an opening of the sixth insulating layer IN6, and a second electrode E2 may be positioned on the emission member EM. The second electrode E2 may be referred to as a common electrode.

The first electrode E1, the emission member EM, and the second electrode E2 may constitute a light emitting diode LED, which may be an organic light emitting diode. The first electrode E1 and the second electrode E2 may serve as an anode and a cathode of the light emitting diode LED, respectively.

An encapsulation layer EC may be located on the second electrode E2. The encapsulation layer EC may encapsulate a light emitting diode LED to prevent moisture or oxygen from penetrating from the outside. The encapsulation layer EC may be a thin film encapsulation layer including one or more inorganic material layers and one or more organic material layers.

A touch sensor layer including a touch electrode TE may be located on the encapsulation layer EC. The touch electrode TE may have a mesh shape having an opening overlapping the light emitting diode LED. A buffer layer may be located between the encapsulation layer EC and the touch sensor layer. A seventh insulating layer IN7 covering the touch electrode TE may be located on the touch sensor layer.

The positions and arrangements of the above devices may be variously changed depending on designs.

While the inventive concept has been described in connection with what is presently considered to be practical embodiments, it is to be understood that the inventive concept is not limited to the disclosed embodiments, but, on the contrary, is intended to cover various modifications and equivalent arrangements included within the spirit and scope of the appended claims, and their equivalents.

What is claimed is:

1. An electronic device package comprising:
   a substrate including a central region, and a first side region and a second side region at opposite sides of the central region;
   a first component in the first side region or the second side region, the first component having a first height above a surface of the substrate;
   a plurality of second components in the central region, the plurality of second components having heights equal to or lower than a second height above the surface of the substrate that is lower than the first height;
   a reinforcement member covering the plurality of second components and free from covering the first component, the reinforcement member having a third height above the surface of the substrate that is lower than the first height and higher than the second height; and
   an encapsulation member covering the first component and a space between the plurality of second components and the reinforcement member.

2. The electronic device package of claim 1, wherein the reinforcement member is covered by the encapsulation member.

3. The electronic device package of claim 2, wherein the substrate includes a ground pad, and the reinforcement member is connected to the ground pad.

4. The electronic device package of claim 1, wherein the reinforcement member covers upper surfaces of the plurality of second components and surrounds at least a portion of side surfaces of the plurality of second components.

5. The electronic device package of claim 4, wherein the reinforcement member has a shape in which a metal plate is bent.

6. The electronic device package of claim 1, wherein the encapsulation member has a fourth height at a first portion thereof covering the first component and a fifth height at a second portion thereof covering the plurality of second components, wherein the fourth height is a same as the fifth height.

7. The electronic device package of claim 1, wherein the reinforcement member has a modulus of 100 GPa or more.

8. The electronic device package of claim 7, wherein the reinforcement member includes stainless steel.

9. A display device comprising:
   a display panel;
   a flexible printed circuit film on the display panel; and
   an electronic device package on the flexible printed circuit film, wherein the electronic device package includes:
   a substrate including a central region, and a first side region and a second side region at opposite sides of the central region;
   a first component in the first side region or the second side region, the first component having a first height above a surface of the substrate;
   a plurality of second components in the central region, the plurality of second components having heights equal to or lower than a second height above the surface of the substrate that is lower than the first height;

a reinforcement member covering the plurality of second components and free from covering the first component, the reinforcement member having a third height above the surface of the substrate that is lower than the first height and higher than the second height; and an encapsulation member covering the first component and a space between the plurality of second components and the reinforcement member.

10. The display device of claim 9, wherein the reinforcement member is covered by the encapsulation member.

11. The display device of claim 10, wherein the substrate includes a ground pad, and the reinforcement member is connected to the ground pad.

12. The display device of claim 9, wherein the reinforcement member covers upper surfaces of the plurality of second components and surrounds at least a portion of side surfaces of the plurality of second components.

* * * * *